(12) United States Patent
Rypl

(10) Patent No.: US 8,293,127 B1
(45) Date of Patent: Oct. 23, 2012

(54) PLASMA ETCHING METHOD

(75) Inventor: Joseph F. Rypl, Grand Prairie, TX (US)

(73) Assignee: Lockheed Martin Corporation, Grand Prairie, TX (US)

( * ) Notice: Subject to any disclaimer, the term of this patent is extended or adjusted under 35 U.S.C. 154(b) by 976 days.

(21) Appl. No.: 11/940,973

(22) Filed: Nov. 15, 2007

Related U.S. Application Data

(60) Provisional application No. 60/866,207, filed on Nov. 16, 2006.

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/67; 216/13

(58) Field of Classification Search .................... 216/13, 216/67; 204/192.32, 192.36
See application file for complete search history.

(56) References Cited

U.S. PATENT DOCUMENTS 4,230,553 A * 10/1980 Bartlett et al. ........... 204/192.36
4,328,081 A * 5/1982 Fazlin ...................... 204/192.32

FOREIGN PATENT DOCUMENTS

EP 208012 A * 1/1987

* cited by examiner

*Primary Examiner* — Roberts Culbert
(74) *Attorney, Agent, or Firm* — Slater & Matsil, L.L.P.

(57) ABSTRACT

A plasma etching method includes placing a printed circuit board into a processing chamber of a plasma etching machine; operating the plasma etching machine with a low concentration of tetrafluoromethane in the processing chamber if the plasma etching machine is operated at a high power level; and operating the plasma etching machine with a high concentration of tetrafluoromethane in the processing chamber if the plasma etching machine is operated at a low power level.

17 Claims, 3 Drawing Sheets

PLASMA ETCHING METHOD

CROSS-REFERENCE TO RELATED APPLICATIONS

This application claims the benefit of U.S. Provisional Application No. 60/866,207; filed 16 Nov. 2006; and entitled "Plasma Etching Method," which is hereby expressly incorporated by reference for all purposes.

BACKGROUND

1. Field of the Invention

The present invention relates to plasma etching. In particular, the present invention relates to a method for plasma etching vias in printed circuit boards.

2. Description of Related Art

Modern printed circuit boards include multiple layers of circuits separated by insulating layers of dielectric material. Such printed circuit boards further include vias or contacts that interconnect circuits that are disposed on different layers. In situations wherein other electrical components are attached to the printed circuit board, contacts of the electronic components extend into the vias and are electrically connected to the desired circuits on various layers of the printed circuit board.

During the manufacture of a printed circuit board, vias are typically formed in the printed circuit board by a drilling process. During the drilling process, dielectric material from the insulating layers is smeared onto the electrically conductive material of the circuits. Prior to insertion of electronic components, the smeared dielectric material must be removed or "de-smeared" from the circuit material. Moreover, it is desirable to "etch back" or remove a small amount of the insulating, dielectric material immediately adjacent the via to improve the electrical connection between the electronic component and the circuits of the printed circuit board.

Radio frequency-driven, low-power plasma etching is often used to de-smear and/or etch back vias in printed circuit boards. Typically oxygen, nitrogen, and tetrafluoromethane are combined and used during the plasma etching process to de-smear and etch back printed circuit boards. Conventional plasma etching processes, however, fail to provide uniform etching through the via, resulting in quality issues. Moreover, the amount of etching varies between vias, specifically between vias of different diameters. Thus, the operating parameters must be adjusted depending upon the size of the vias in a particular printed circuit board. Also, it is conventionally recognized that higher levels of tetrafluoromethane result in higher etching rates. Higher amounts of tetrafluoromethane, however, increase the operating costs of conventional plasma etching processes.

There are many plasma etching processes well known in the art, however, considerable shortcomings remain.

DESCRIPTION OF THE DRAWINGS

The novel features believed characteristic of the invention are set forth in the appended claims. However, the invention itself, as well as, a preferred mode of use, and further objectives and advantages thereof, will best be understood by reference to the following detailed description when read in conjunction with the accompanying drawings, wherein:

Figure 1:
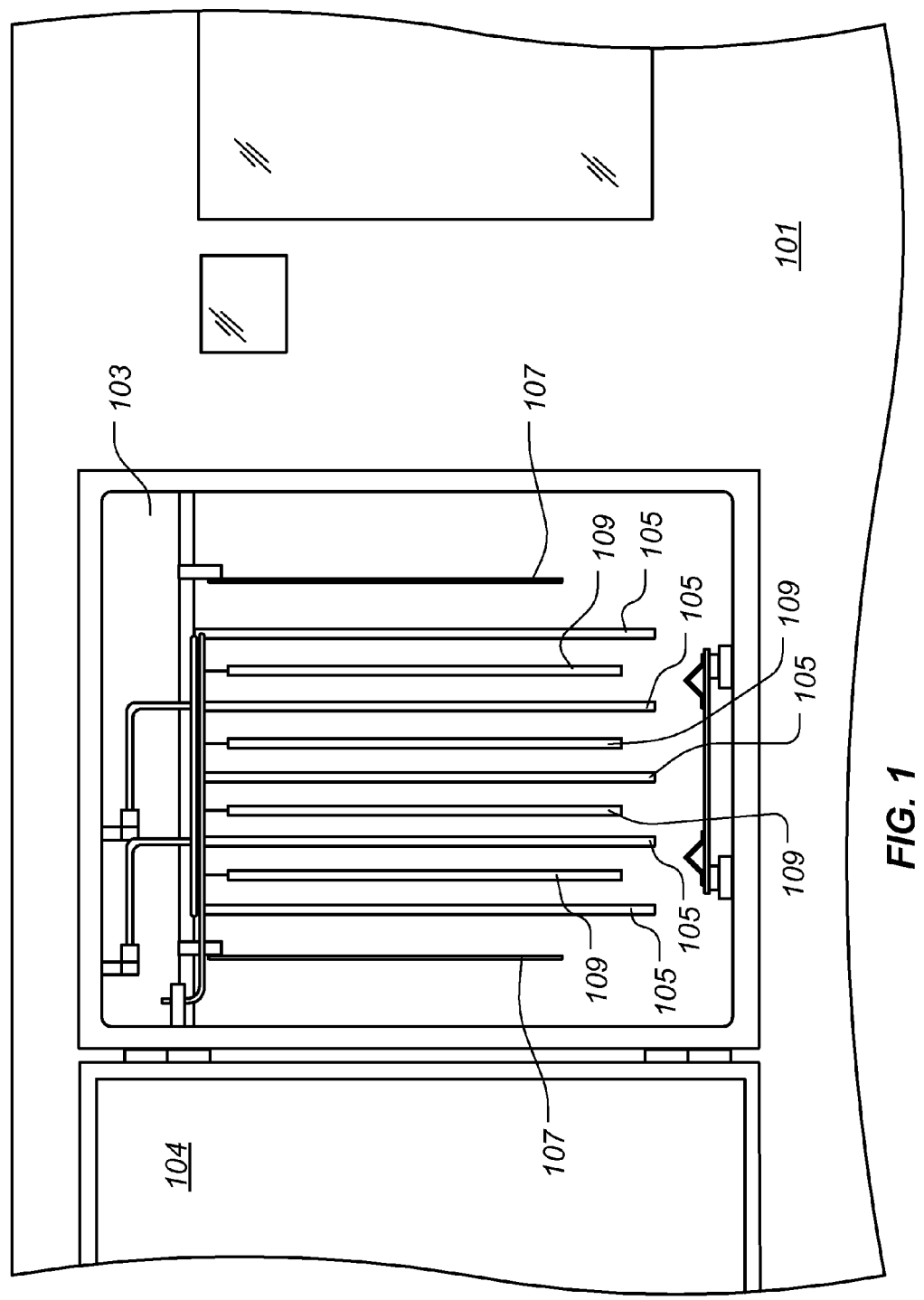
FIG. 1 is a side, elevational view of a portion of a plasma etching machine.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENT

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present invention represents a new plasma etching method. The method is particularly well suited for removing dielectric materials from printed circuit board vias. For the purposes of this disclosure, the term "via" means an opening extending at least partially through a thickness of a printed circuit board, through which electrical circuits on various layers of a printed circuit board are connected to one another and/or through which electrical circuits on various layers of a printed circuit board are connected to an electronic device operably associated with the printed circuit board. Moreover, for the purposes of this disclosure, the term "plasma" means a gas comprising atoms or molecules of the gas and free electrons that are not bound to an atom or molecule of the gas.

FIG. 1 depicts a portion of a plasma etching machine 101 having a processing chamber 103 sealable by a door 104 when a plasma etching process is in use. Within chamber 103 are a plurality of electrodes 105 disposed between baffles 107. Gases, such as nitrogen, oxygen, and tetrafluoromethane, sometimes referred to as carbon tetrafluoride or "$CF_4$," are introduced into the chamber and a plasma is established between electrodes 105 and one or more printed circuit boards 109 disposed therebetween. Baffles 107 help confine the plasma about printed circuit boards 109, so that a more uniform etching of vias may be accomplished. More specifically, baffles 107 help confine the plasma about printed circuit boards 109 immediately adjacent to baffles 107 to assist in uniform etching of vias of printed circuit boards 109 immediately adjacent to baffles 107.

The scope of the present invention encompasses controlling one or more of the following parameters in particular relationships during a plasma etching process: the processing temperature; the gas flow rate; the power; the recirculation time; and the concentration of tetrafluoromethane. In one embodiment of the present invention, a plasma etching method is performed in which the concentration of tetrafluoromethane is regulated in an unconventional relationship to the etching rate desired or the amount of etching desired. Conventionally, those of ordinary skill in the art understand that etching rate is proportional to the concentration of tetrafluoromethane in the etching processing gas. In other words, it is conventionally known that higher concentrations of tetrafluoromethane in etching processing gases produce greater etching rates. However, Applicant has discovered that, above a certain concentration of tetrafluoromethane in the etching processing gas, the etching rate is inversely proportional to the concentration of tetrafluoromethane in the etching processing gas.

Applicant has also discovered that, while etching rates at low concentrations of tetrafluoromethane and at high concentrations of tetrafluoromethane in etching processing gas produce similar, low etching rates, etching uniformity along the length of a via is improved at higher concentrations of tetrafluoromethane over lower concentrations of tetrafluoromethane. Uniformity of etch is particularly difficult to achieve in small diameter vias and/or in vias that have large depth-to-diameter ratios. Moreover, Applicant has discovered that, while the amount of electrical power used in the plasma etching process has a significant effect on the etching rate when low concentrations of tetrafluoromethane are used in the etching gas, the amount of electrical power used in the plasma etching process has little or no effect on the etching rate when high concentrations of tetrafluoromethane are used in the etching gas.

Thus, in one embodiment of the present invention, a plasma etching method is performed in which the concentration of tetrafluoromethane is maintained at a low level, such as a concentration of about 5%, if a high power level, such as a level of about 5 kW, is employed to optimize the etching rate. Note that, for the purposes of this disclosure, the term "high power" means electrical power greater than about 4.5 kW. For the purposes of this disclosure, a low concentration of tetrafluoromethane is a concentration less than about 8%. If a high concentration of tetrafluoromethane, such as a concentration of about 15%, is used in the plasma etching process, the power is not closely controlled, as the level of power does not substantially affect the etching rate. Thus, it is more economical to perform the plasma etching process at a low power when a high concentration of tetrafluoromethane is used. For the purposes of this disclosure, a high concentration of tetrafluoromethane is a concentration greater than about 12%.

While not having significant impacts upon the plasma etching process individually, an embodiment of the present invention includes controlling a combination of the process temperature, the gas flow rate, the power, and the recirculation time. Gases are introduced into chamber 103 via a plurality of ports (not shown). Each of these ports may be selectively used as input ports, through which gases are introduced into chamber 103, or as output ports, through which gases are evacuated from chamber 103. Periodically, the function of the ports is switched, such that the input ports now act as output ports and the output ports now act as input ports to provide better distribution of gases during the plasma etching process. The recirculation time is the amount of elapsed time between switching ports.

For one particular plasma etching process, a process temperature of about 80° C., a gas flow rate of about 1.5 standard cubic feet per minute ("scf"), a power setting of about 4 kW, a recirculation time of about 4 minutes, and a tetrafluoromethane concentration of about 15% was found to produce significant improvements in via uniformity, both within a via and between vias.

Figure 2:
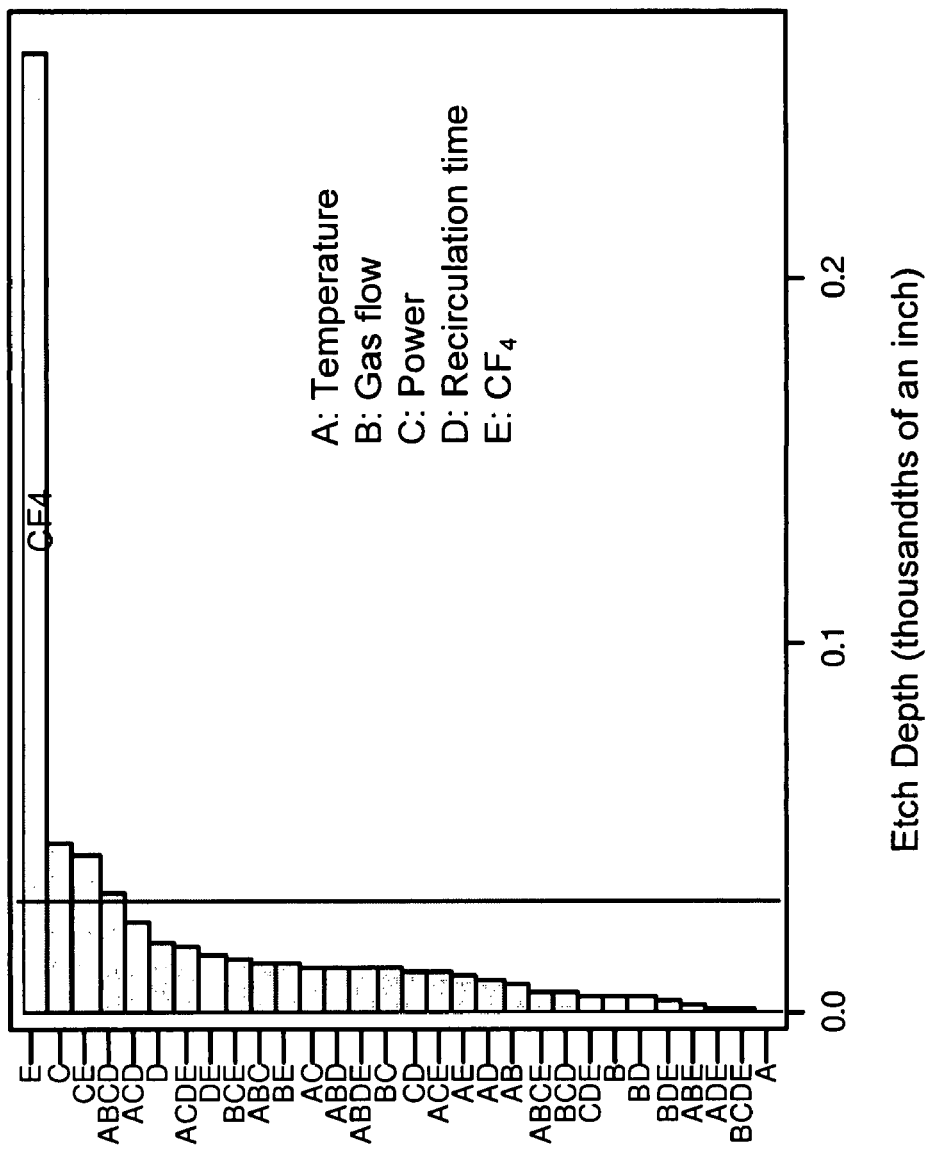
FIGS. 2 and 3 are graphical representations of the results of a designed experiment employing the present invention.
Figure 3:
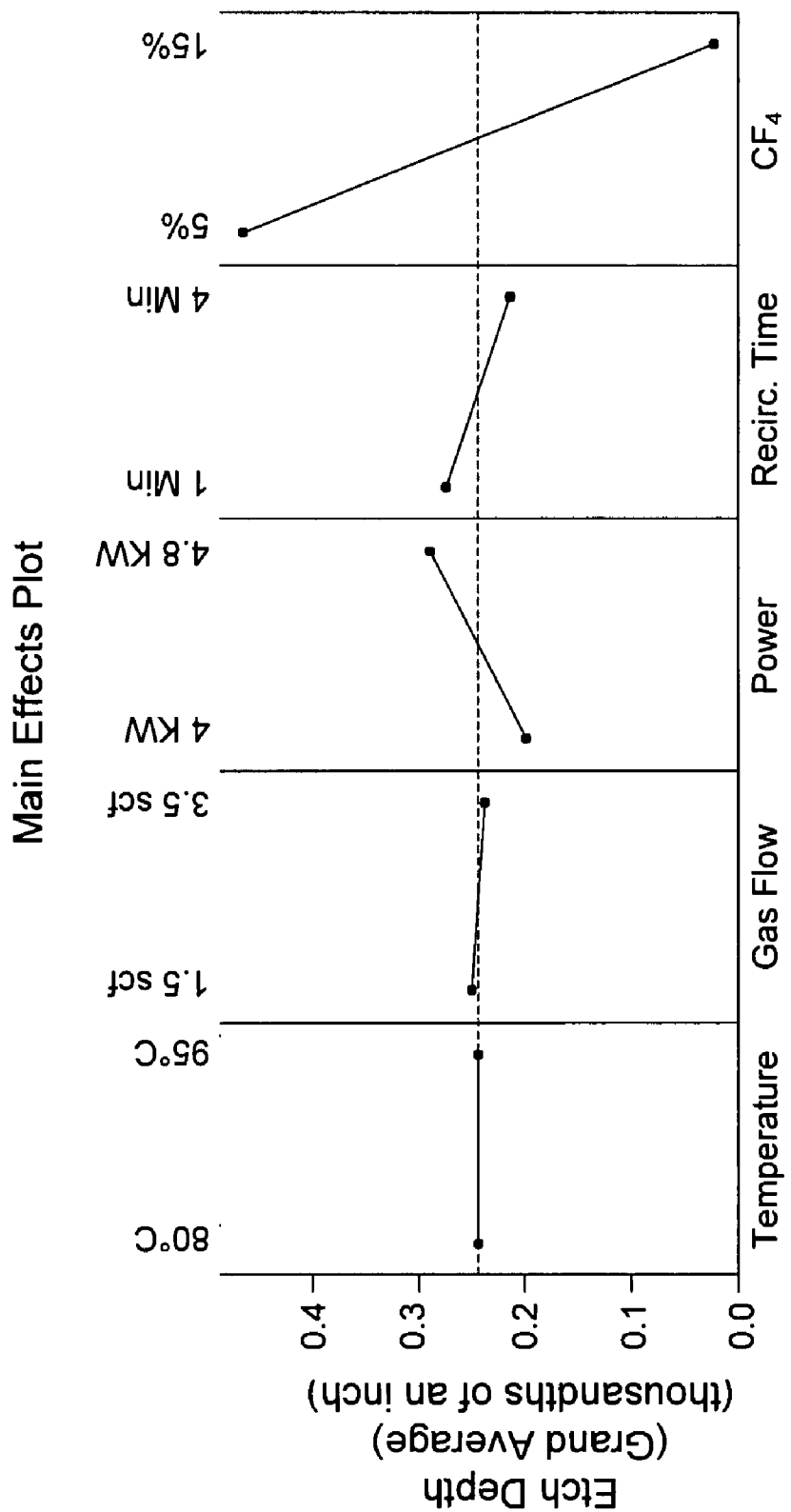

FIGS. 2-3 provide graphical representations of the results of a plasma etching designed experiment conducted using a March Plasma Etch Chamber employing an etching gas comprising oxygen, nitrogen, and tetrafluoromethane to etch vias exhibiting diameters of about 0.010 inches in a multilayered, type 45n printed circuit boards. FIG. 2 illustrates the results of a Pareto analysis of the effects of process temperature, gas flow rate, electrical power level, recirculation time, and tetrafluoromethane concentration on etch depth. The effects of tetrafluoromethane concentration; electrical power level; a two-way interaction between the concentration of tetrafluoromethane concentration and electrical power level; and a four-way interaction between process temperature, gas flow rate, electrical power level, and gas recirculation time were each found to be significant at a 90% confidence level to etch depth. It should be noted, however, that the concentration of tetrafluoromethane provided the greatest response, with lower concentrations of tetrafluoromethane producing higher etch depths in the illustrated embodiment.

FIG. 3 illustrates a single main effects analysis resulting from the designed experiment. Process temperature, between about 80° C. and about 95° C., and gas flow rate, between about 1.5 scf and about 3.5 scf, were found to provide no significant effect on the etching process. Gas recirculation time, between about one minute and about four minutes, provided some contribution to the etching process but was not significant. Electrical power level, between about 4 kW and about 4.8 kW, and tetrafluoromethane concentration, between about 5% and about 15%, provided significant effects to the etching process. The effect of the concentration of tetrafluoromethane, however, was overriding, with lower concentrations of tetrafluoromethane producing higher etch depths in the illustrated embodiment.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below. It is apparent that an invention with significant advantages has been described and illustrated. Although the present invention is shown in a limited number of forms, it is not limited to just these forms, but is amenable to various changes and modifications without departing from the spirit thereof.

What is claimed is:

1. A plasma etching method, comprising:
   placing a printed circuit board into a processing chamber between first and second electrodes of a plasma etching machine;
   operating the plasma etching machine with a low concentration of tetrafluoromethane in the processing chamber if the plasma etching machine is operated at a high power level;
   operating the plasma etching machine with a high concentration of tetrafluoromethane in the processing chamber if the plasma etching machine is operated at a low power level; and
   utilizing one or more baffles on an opposing side of at least one of the first and second electrodes from the printed circuit board in the processing chamber to aid in confining a plasma, generated by the plasma etching machine, about the printed circuit board.

2. A plasma etching method, comprising:
   placing a printed circuit board into a processing chamber between first and second electrodes of a plasma etching machine; and
   operating the plasma etching machine at a power level less than about 4.5 kW with process gas having a tetrafluoromethane concentration of greater than about 12%; and utilizing one or more baffles on an opposing side of at least one of the first and second electrodes from the printed circuit board in the processing chamber to aid in confining a plasma, generated by the plasma etching machine, about the printed circuit board.

3. The plasma etching method, according to claim 2, wherein operating the plasma etching machine is accomplished at a power level of about 4 kW with process gas having a tetrafluoromethane concentration of about 15%.

4. The plasma etching method, according to claim 3, wherein operating the plasma etching machine is accomplished at a temperature of about 80° C.

5. The plasma etching method, according to claim 4, wherein operating the plasma etching machine is accomplished at a gas flow rate of about 1.5 scf.

6. The plasma etching method, according to claim 5, wherein operating the plasma etching machine is accomplished at a gas recirculation time of about four minutes.

7. The plasma etching method, according to claim 2, wherein operating the plasma etching machine is accomplished at a temperature of about 80° C.

8. The plasma etching method, according to claim 2, wherein operating the plasma etching machine is accomplished at a gas flow rate of about 1.5 scf.

9. The plasma etching method, according to claim 2, wherein operating the plasma etching machine is accomplished at a gas recirculation time of about four minutes.

10. A plasma etching method, comprising:
  placing a printed circuit board into a processing chamber between first and second electrodes of a plasma etching machine; and
  operating the plasma etching machine at a power level greater than about 4.5 kW with process gas having a tetrafluoromethane concentration of less than about 8%; and
  utilizing one or more baffles on an opposing side of at least one of the first and second electrodes from the printed circuit board in the processing chamber to aid in confining a plasma, generated by the plasma etching machine, about the printed circuit board.

11. The plasma etching method, according to claim 10, wherein operating the plasma etching machine is accomplished at a power level of about 4.8 kW with process gas having a tetrafluoromethane concentration of about 5%.

12. The plasma etching method, according to claim 11, wherein operating the plasma etching machine is accomplished at a temperature of about 80° C.

13. The plasma etching method, according to claim 12, wherein operating the plasma etching machine is accomplished at a gas flow rate of about 1.5 scf.

14. The plasma etching method, according to claim 13, wherein operating the plasma etching machine is accomplished at a gas recirculation time of about one minute.

15. The plasma etching method, according to claim 10, wherein operating the plasma etching machine is accomplished at a temperature of about 80° C.

16. The plasma etching method, according to claim 10, wherein operating the plasma etching machine is accomplished at a gas flow rate of about 1.5 scf.

17. The plasma etching method, according to claim 10, wherein operating the plasma etching machine is accomplished at a gas recirculation time of about one minute.

* * * * *